United States Patent
Tanaka et al.

(10) Patent No.: US 10,256,166 B2
(45) Date of Patent: Apr. 9, 2019

(54) SEMICONDUCTOR DEVICE

(71) Applicant: FUJI ELECTRIC CO., LTD., Kawasaki-shi, Kanagawa (JP)

(72) Inventors: Masanori Tanaka, Matsumoto (JP); Tadanori Yamada, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/200,972

(22) Filed: Jul. 1, 2016

(65) Prior Publication Data
US 2017/0047280 A1 Feb. 16, 2017

(30) Foreign Application Priority Data

Aug. 13, 2015 (JP) ................................. 2015-159812

(51) Int. Cl.
| | |
|---|---|
| *H01L 23/04* | (2006.01) |
| *H01L 23/31* | (2006.01) |
| *H01L 23/498* | (2006.01) |
| *H01L 23/373* | (2006.01) |
| *H01L 23/24* | (2006.01) |

(52) U.S. Cl.
CPC .......... *H01L 23/3114* (2013.01); *H01L 23/04* (2013.01); *H01L 23/3735* (2013.01); *H01L 23/49861* (2013.01); *H01L 23/24* (2013.01)

(58) Field of Classification Search
CPC ................................. H01L 23/02; H01L 23/04
See application file for complete search history.

(56) References Cited

U.S. PATENT DOCUMENTS

| | | | | |
|---|---|---|---|---|
| 2004/0208210 A1* | 10/2004 | Inoguchi | ............. | H01L 25/0753 372/36 |
| 2011/0203836 A1* | 8/2011 | Yokota | ..................... | H01L 24/18 174/250 |
| 2012/0061819 A1* | 3/2012 | Siemieniec | ......... | H01L 23/3107 257/734 |
| 2014/0374889 A1 | 12/2014 | Denta et al. | | |

FOREIGN PATENT DOCUMENTS

| | | |
|---|---|---|
| JP | 2002-043509 A | 2/2002 |
| JP | 2009-130168 A | 6/2009 |
| JP | 2013-258321 A | 12/2013 |

\* cited by examiner

*Primary Examiner* — Jae Lee
(74) *Attorney, Agent, or Firm* — Rabin & Berdo, P.C.

(57) ABSTRACT

A semiconductor device includes a resin case which houses a semiconductor element, a plurality of lead frames disposed in the principal plane of a base of the resin case with spaces therebetween, and a block portion disposed over a space between adjacent lead frames along the adjacent lead frames. With the semiconductor device, the disposition of the block portion makes creepage distance long, compared with a case where the block portion is not disposed and therefore a space between the adjacent lead frames is flat. Accordingly, even if metal atoms contained in the lead frames or the like migrate on an insulator or at an interface because of migration, a conduction path is hardly formed between the adjacent lead frames. That is to say, a short circuit hardly occurs between the adjacent lead frames with the block portion therebetween. This semiconductor device provides improved reliability.

12 Claims, 7 Drawing Sheets

SEMICONDUCTOR DEVICE

CROSS-REFERENCE TO RELATED APPLICATION

This application is based upon and claims the benefit of priority of the prior Japanese Patent Application No. 2015-159812, filed on Aug. 13, 2015, the entire contents of which are incorporated herein by reference.

BACKGROUND OF THE INVENTION

1. Field of the Invention

The embodiments discussed herein are related to a semiconductor device.

2. Background of the Related Art

A semiconductor device in which a circuit board over whose upper surface a semiconductor element is disposed is housed in a case is known. With such a semiconductor device a plurality of wiring patterns made of metal, such as copper, are included in an insulating case. Furthermore, an electronic part is joined to each wiring pattern with a conductive adhesive.

Japanese Laid-open Patent Publication No. 2013-258321

With a semiconductor device metal atoms contained in a wiring pattern, a conductive adhesive, or the like may migrate on an insulator or at an interface due to an electric field. That is to say, a migration may occur.

When metal atoms migrate on an insulator or at an interface as a result of a migration, a conduction path may be formed between adjacent wiring patterns. In this case, a short circuit occurs and the reliability of the semiconductor device may deteriorate.

SUMMARY OF THE INVENTION

According to an aspect, there is provided a semiconductor device including a case which houses a semiconductor element, a first wiring pattern disposed in a principal plane of a base of the case, a second wiring pattern disposed in the principal plane adjacently to the first wiring pattern with a space therebetween, and a block portion disposed over the space in the principal plane along the first wiring pattern and the second wiring pattern.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Embodiments will now be described with reference to the accompanying drawings, wherein like reference numerals refer to like elements throughout.

(First Embodiment)

A semiconductor device according to a first embodiment will be described by the use of FIGS. 1 and 2.

Figure 1:
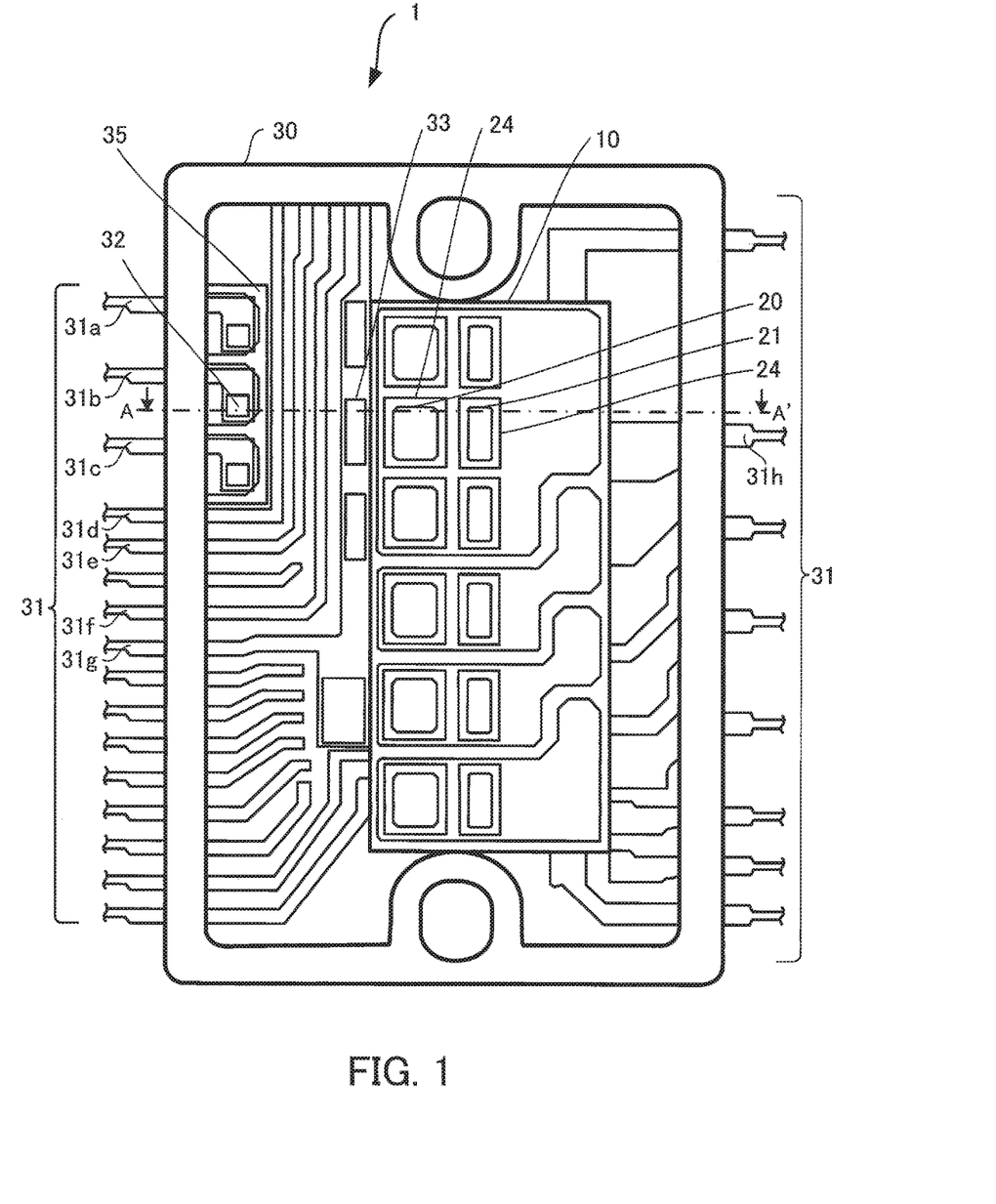
FIG. 1 is a plan view of a semiconductor device according to a first embodiment.
Figure 2:
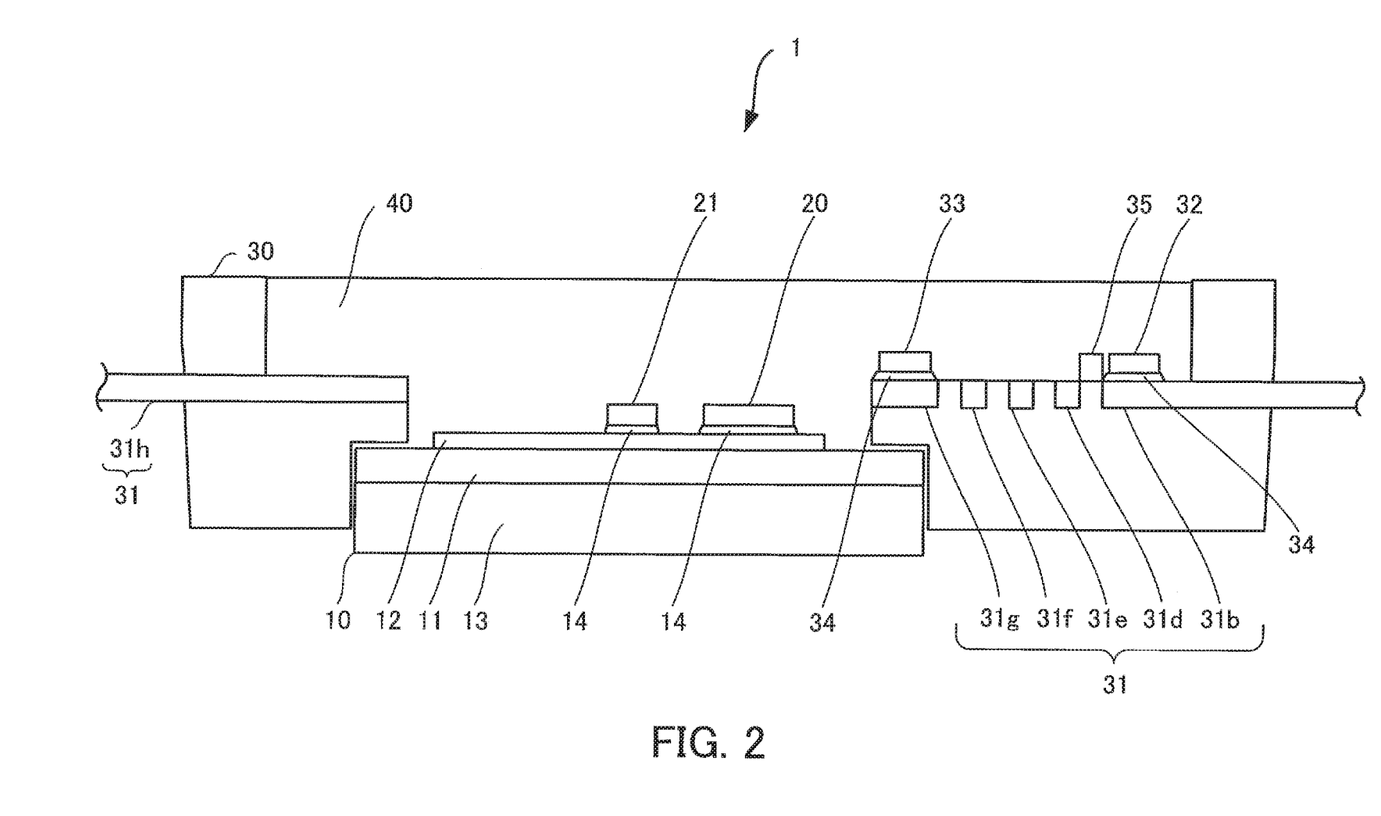
FIG. 2 is a cross-sectional view of the semiconductor device according to the first embodiment.

FIG. 1 is a plan view of a semiconductor device according to a first embodiment. FIG. 2 is a cross-sectional view of the semiconductor device according to the first embodiment taken along the line A-A' of FIG. 1.

A semiconductor device 1 includes a circuit board 10 over which a plurality of semiconductor elements 20 and a plurality of semiconductor elements 21 are disposed and a resin case 30 which houses the circuit board 10.

The circuit board 10 includes an insulating board 11, a circuit layer 12 formed over a front surface of the insulating board 11, and a second metal layer 13 formed over a back surface of the insulating board 11.

The insulating board 11 is made of a ceramic material, such as alumina, aluminum nitride, or silicon nitride. The circuit layer 12 is made of a material (such as copper) whose electrical conduction property is excellent. The second metal layer 13 is made of a material (such as copper) whose heat conduction property is excellent.

The semiconductor elements 20 and 21 are insulated gate bipolar transistors (IGBTs), metal oxide semiconductor field effect transistors (MOSFETs), and free wheeling diodes (FWDs), or the like. These semiconductor elements 20 and 21 are joined to the circuit layer 12 of the circuit board 10 with a conductive adhesive 14 containing metal such as silver.

The resin case 30 is made of an insulating resin. A rectangular opening which houses the circuit board 10 over which the plurality of semiconductor elements 20 and the plurality of semiconductor elements 21 are disposed is formed in a central area of a base of the resin case 30. Furthermore, a plurality of lead frames 31 for external connection are disposed in a principal plane (front surface) of the base of the resin case 30 with spaces therebetween. The lead frames 31 are wiring patterns made of metal such as copper.

Electronic parts 32 are joined to lead frames 31a, 31b, and 31c with a conductive adhesive 34 containing metal such as silver. Electronic parts 33 are joined to a lead frame 31g with the conductive adhesive 34 containing metal such as silver. The electronic parts 32 and 33 are boot strap diodes (BSDs), integrated circuits (ICs), or the like.

In addition, an insulating block portion (convex portion) 35, which is rectangular in a cross-sectional view, is disposed over a space between adjacent lead frames 31 along the adjacent lead frames 31 on the principal plane of the base of the resin case 30. To be concrete, the block portion 35 is disposed over a space between the lead frames 31a and 31b along the lead frames 31a and 31b and over a space between the lead frames 31b and 31c along the lead frames 31b and 31c. Furthermore, the block portion 35 is disposed over a space between the lead frame 31a and a lead frame 31d along the lead frames 31a and 31d, over a space between the lead frames 31b and 31d along the lead frames 31b and 31d, and over a space between the lead frames 31c and 31d along the lead frames 31c and 31d.

Moreover, the block portion 35 is disposed in a state in which it extends over corner portions of the lead frames 31a, 31b, and 31c. The block portion 35 may be disposed in a state in which it also extends over portions other than the corner portions of the lead frames 31a, 31b, and 31c.

For example, the block portion 35 and the resin case 30 are made of the same material and are integrally molded. The height of the block portion 35 is 0.1 to 1.0 times the spatial distance between lead frames 31 adjacent to a place in which the block portion 35 is disposed (shortest distance through space between the lead frames 31). For example, the spatial distance between the lead frames 31b and 31d is 0.6 mm and the height of the block portion 35 is 0.3 mm. At this time the creepage distance between the lead frames 31b and 31d adjacent to the place in which the block portion 35 is disposed (shortest distance between the lead frames 31b and 31d along the surface of the insulator) is 1.2 mm (=0.3 mm+0.6 mm+0.3 mm). A place in which the block portion 35 is disposed is not limited to the above place. The block portion 35 may be disposed between other lead frames 31.

Furthermore, with the semiconductor device 1 electrodes (not illustrated) of the semiconductor elements 20 and 21 are electrically connected to the lead frames 31 or the electronic parts 32 and 33 by wires (not illustrated). In addition, with the semiconductor device 1 the circuit board 10 and the semiconductor elements 20 and 21 housed in the resin case 30 are sealed with a sealing resin 40.

As has been described, with the semiconductor device 1 the insulating block portion 35 is disposed between adjacent lead frames 31. This makes the creepage distance between the adjacent lead frames 31 long, compared with a case where the block portion 35 is not disposed and therefore a space between the adjacent lead frames 31 is flat.

Even if metal atoms contained in the conductive adhesive 34 or a lead frame 31 migrate on an insulator or at an interface because of migration, a long creepage distance makes it difficult to form a conduction path between the adjacent lead frames 31 with the block portion 35 therebetween.

That is to say, with the semiconductor device 1 the disposition of the block portion 35 suppresses a short circuit which may occur due to migration between the adjacent lead frames 31 with the block portion 35 therebetween. As a result, the reliability of the semiconductor device 1 is improved.

For example, the block portion 35 is disposed over a space between adjacent lead frames 31, of the plurality of lead frames 31, between which the difference in voltage is greater than or equal to a determined value along the adjacent lead frames 31. With an increase in electric field strength, migration tends to occur. That is to say, with an increase in the difference in voltage between adjacent lead frames 31, migration tends to occur. Accordingly, the block portion 35 is disposed over a space between adjacent lead frames 31 between which the difference in voltage is greater than or equal to the determined value along the adjacent lead frames 31. By doing so, the influence of migration is effectively curbed in the semiconductor device 1.

Furthermore, with the semiconductor device 1 the disposition of the block portion 35 makes the creepage distance between adjacent lead frames 31 long even if the spatial distance between the adjacent lead frames 31 is reduced for miniaturization or the like. As a result, distance longer than or equal to creepage distance corresponding to required withstand voltage is secured. That is to say, with the semiconductor device 1 the disposition of the block portion 35 combines the maintenance of an insulating property and miniaturization.

In addition, with the semiconductor device 1 the block portion 35 is disposed over a space between adjacent lead frames 31 along the adjacent lead frames 31. This prevents, at the time of applying the conductive adhesive 34, the conductive adhesive 34 from spreading (scattering) outside a lead frame 31. As a result, the assemble-ability of the semiconductor device 1 is improved.

Furthermore, with the semiconductor device 1 the block portion 35 is disposed in a state in which it extends over the lead frames 31. As a result, creepage distance is long at parts of the block portion 35 extending over the lead frames 31 and the lifting (fluttering) of the lead frames 31 is suppressed.

(Modifications)

Modifications of the shape of the block portion 35 will now be described by the use of FIGS. 3A, 3B, 3C, and 3D. FIGS. 3A, 3B, 3C, and 3D illustrate modifications of the block portion of the semiconductor device according to the first embodiment and are fragmentary cross-sectional views of the semiconductor device 1.

Figure 3A:
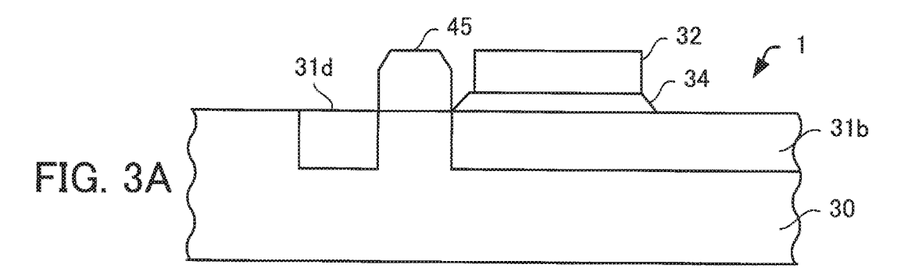
FIGS. 3A, 3B, 3C, and 3D illustrate modifications of a block portion of the semiconductor device according to the first embodiment.

A block portion 45 illustrated in FIG. 3A gets narrow in a cross-sectional view on a side opposite the base of the resin case 30 so as to slope (taper). By disposing this block portion 45 which gets narrow on the side opposite the base of the resin case 30 so as to slope, the sealing resin 40 gets into a space among the block portion 45, the electronic part 32, the conductive adhesive 34, and the lead frame 31b. As a result, adhesion is easy compared with a case where the block portion 35 is disposed. That is to say, if the block portion 45 is used, the sealing capability of the sealing resin 40 is large compared with a case where the block portion 35 is used. Furthermore, with the semiconductor device 1 the disposition of the sloping block portion 45 disperses stress compared with a case where the block portion 35 is disposed. This prevents the sealing resin 40 from peeling off.

By the way, it is known that with the semiconductor device 1 sealed with the sealing resin 40, moisture in the sealing resin 40 gets into a portion which peels off (portion which does not adhere). In addition, it is known that with an increase in the amount of moisture (humidity), migration tends to occur.

From the above viewpoints, with the semiconductor device 1 the block portion 45 is used. Compared with a case where the block portion 35 is used, this improves the sealing capability of the sealing resin 40, prevents the sealing resin 40 from peeling off, and prevents moisture from getting into the lead frame 31b or 31d or the conductive adhesive 34. As a result, with the semiconductor device 1, migration is suppressed and the reliability is improved further.

Figure 3B:
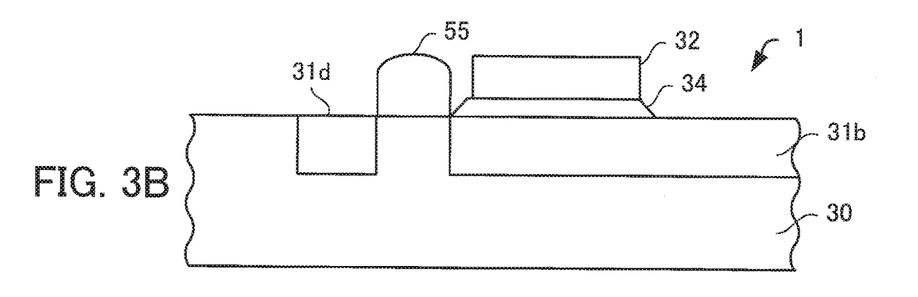

A block portion 55 illustrated in FIG. 3B has a convex elliptic arc (e.g., circular arc) shape in a cross-sectional view on a side opposite the base of the resin case 30. By disposing this block portion 55 which has a convex elliptic arc shape on the side opposite the base of the resin case 30, the sealing resin 40 gets into a space among the block portion 55, the electronic part 32, the conductive adhesive 34, and the lead frame 31b. As a result, adhesion is easy compared with a case where the block portion 35 is disposed. That is to say, if the block portion 55 is used, the sealing capability of the sealing resin 40 is large compared with a case where the block portion 35 is used. Furthermore, with the semiconductor device 1 the disposition of the block portion 55 having a convex elliptic arc shape on the side opposite the base of the resin case 30 disperses stress compared with a case where the block portion 35 is disposed. This prevents the sealing resin 40 from peeling off.

With the semiconductor device 1 the block portion 55 is used. Compared with a case where the block portion 35 is used, this improves the sealing capability of the sealing resin 40, prevents the sealing resin 40 from peeling off, and prevents moisture from getting into the lead frame 31b or 31d or the conductive adhesive 34. As a result, with the semiconductor device 1, migration is suppressed and the reliability is improved further.

Figure 3C:
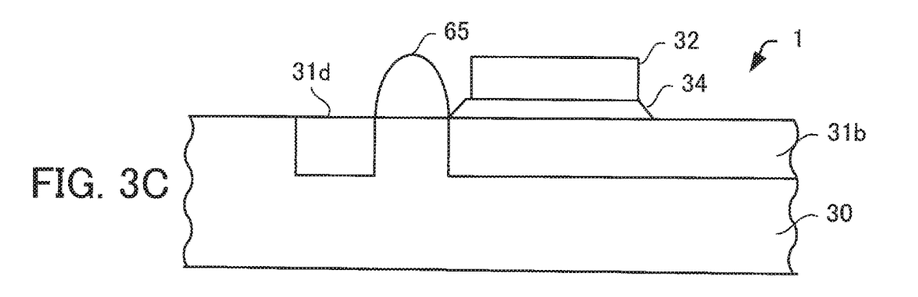

A block portion 65 illustrated in FIG. 3C has an elliptic arc shape in a cross-sectional view. By disposing this block portion 65 having an elliptic arc shape, the sealing resin 40 gets into a space among the block portion 65, the electronic part 32, the conductive adhesive 34, and the lead frame 31b. As a result, adhesion is easy compared with a case where the block portion 35 is disposed. That is to say, if the block portion 65 is used, the sealing capability of the sealing resin 40 is large compared with a case where the block portion 35 is used. Furthermore, with the semiconductor device 1 the disposition of the block portion 65 having an elliptic arc shape disperses stress compared with a case where the block portion 35 is disposed. This prevents the sealing resin 40 from peeling off.

With the semiconductor device 1 the block portion 65 is used. Compared with a case where the block portion 35 is used, this improves the sealing capability of the sealing resin 40, prevents the sealing resin 40 from peeling off, and prevents moisture from getting into the lead frame 31b or 31d or the conductive adhesive 34. As a result, with the semiconductor device 1, migration is suppressed and the reliability is improved further.

Figure 3D:
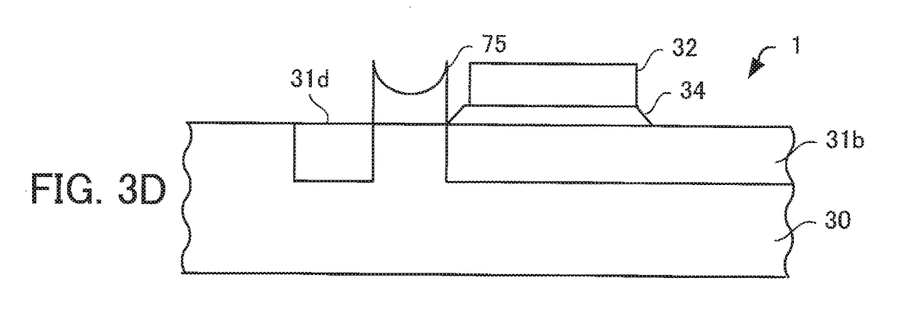

A block portion 75 illustrated in FIG. 3D has a concave elliptic arc shape in a cross-sectional view on a side opposite the base of the resin case 30. With the semiconductor device 1 creepage distance is long as a result of disposing the block portion 75 having a concave elliptic arc shape on the side opposite the base of the resin case 30, compared with a case where the block portion 35 with a flat tip is disposed. In addition, with the semiconductor device 1 the disposition of the block portion 75 having a concave elliptic arc shape on the side opposite the base of the resin case 30 disperses stress compared with a case where the block portion 35 is disposed. This prevents the sealing resin 40 from peeling off.

With the semiconductor device 1 the block portion 75 is used. Compared with a case where the block portion 35 is used, this prevents the sealing resin 40 from peeling off and prevents moisture from getting into the lead frame 31b or 31d or the conductive adhesive 34.

As a result, with the semiconductor device 1 the use of the block portion 75 suppresses migration. Accordingly, a short circuit caused by migration is suppressed further and the reliability is improved further.

(Second Embodiment)

In the first embodiment the creepage distance between adjacent lead frames is made long by disposing a block portion between the adjacent lead frames. In a second embodiment, on the other hand, a groove portion (concave portion) is formed between adjacent lead frames in place of a block portion. By doing so, the creepage distance between the adjacent lead frames is made long.

Figure 4:
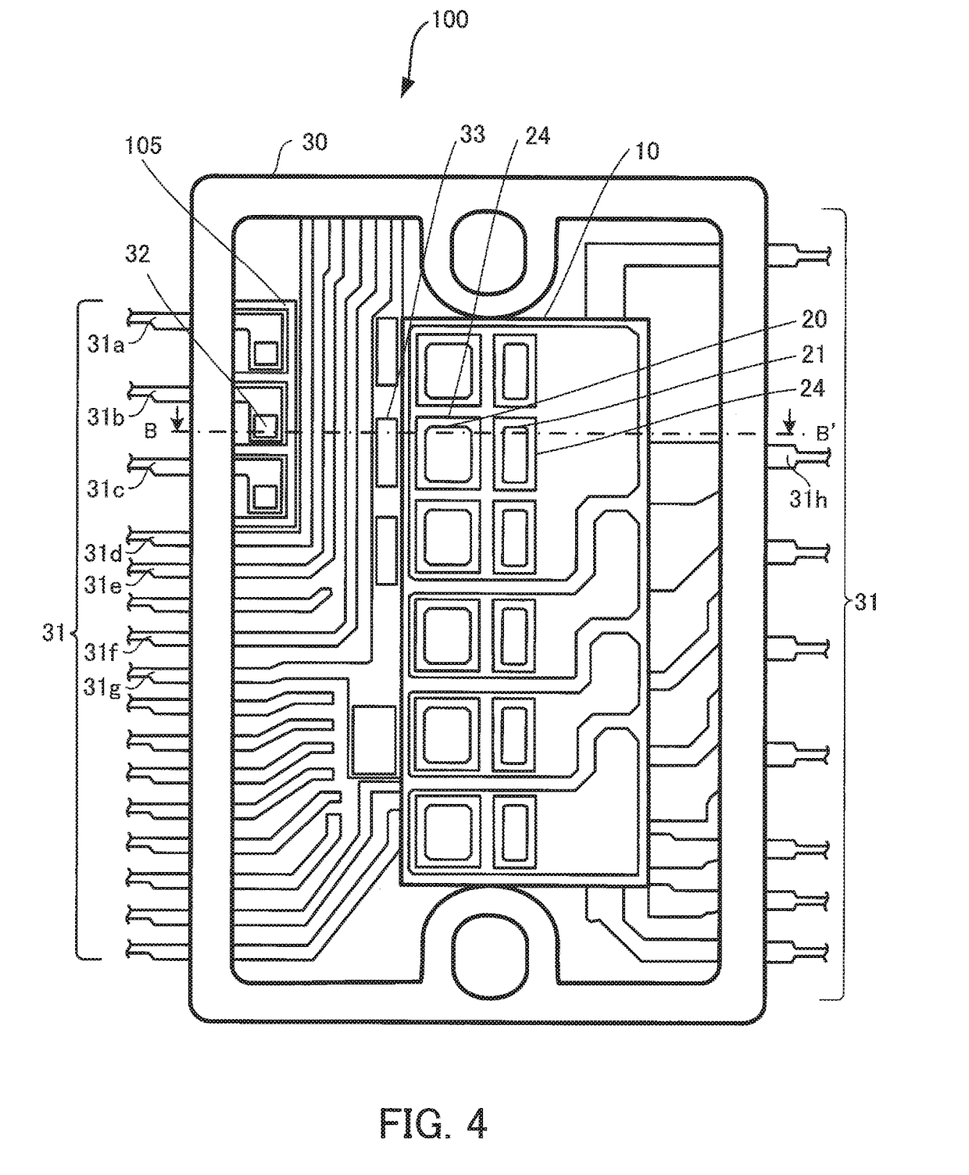
FIG. 4 is a plan view of a semiconductor device according to a second embodiment.
Figure 5:
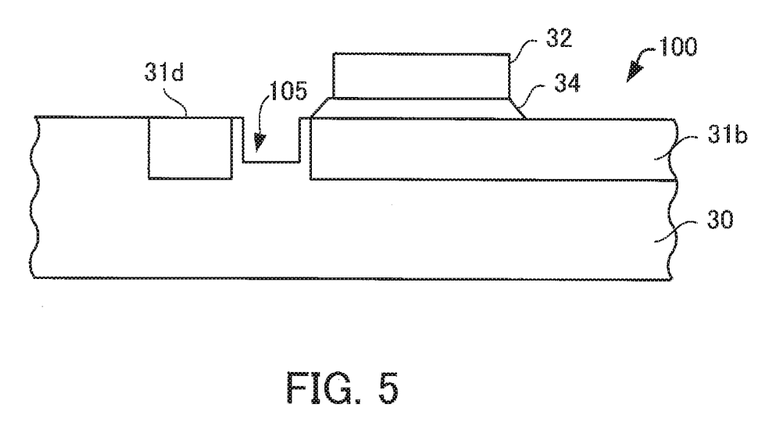
FIG. 5 is a fragmentary cross-sectional view of the semiconductor device according to the second embodiment.

A second embodiment will be described by the use of FIGS. 4 and 5. FIG. 4 is a plan view of a semiconductor device according to a second embodiment. FIG. 5 is a fragmentary cross-sectional view of the semiconductor device according to the second embodiment taken along the line B-B' of FIG. 4.

In a principal plane of a base of a resin case 30 of a semiconductor device 100, a groove portion 105 which is rectangular in a cross-sectional view is formed in part of a space between adjacent lead frames 31 along the adjacent lead frames 31 so that the adjacent lead frames 31 will not be exposed.

To be concrete, the groove portion 105 is formed in part of a space between lead frames 31a and 31b along the lead frames 31a and 31b and in part of a space between the lead frame 31b and a lead frame 31c along the lead frames 31b and 31c. Furthermore, the groove portion 105 is formed in part of a space between the lead frame 31a and a lead frame 31d along the lead frames 31a and 31d, in part of a space between the lead frames 31b and 31d along the lead frames 31b and 31d, and in part of a space between the lead frames 31c and 31d along the lead frames 31c and 31d.

The depth of the groove portion 105 from the base (principal plane of the base) of the resin case 30 is 0.1 to 1.0 times the spatial distance between lead frames 31 adjacent to a place in which the groove portion 105 is formed. For example, the spatial distance between the lead frames 31b and 31d is 0.6 mm and the depth of the groove portion 105 from the base is 0.3 mm. At this time the creepage distance between the lead frames 31b and 31d adjacent to the place in which the groove portion 105 is disposed is 1.2 mm (=0.3 mm+0.6 mm+0.3 mm).

A place in which the groove portion 105 is disposed is not limited to the above place. The groove portion 105 may be disposed between other lead frames 31. Except for the groove portion 105, the structure of the semiconductor device 100 is the same as that of the semiconductor device 1 according to the first embodiment.

As has been described, with the semiconductor device 100 the groove portion 105 is formed in part of a space between adjacent lead frames 31. By doing so, the creepage distance between the adjacent lead frames 31 becomes long, compared with a case where the groove portion 105 is not formed and therefore the space between the adjacent lead frames 31 is flat.

Even if metal atoms contained in a conductive adhesive 34 or a lead frame 31 migrate on an insulator or at an interface because of migration, a long creepage distance makes it difficult to form a conduction path between adjacent lead frames 31 with the groove portion 105 therebetween.

That is to say, with the semiconductor device 100 the formation of the groove portion 105 suppresses a short circuit which may occur due to migration between the adjacent lead frames 31 with the groove portion 105 therebetween. As a result, the reliability of the semiconductor device 100 is improved.

For example, the groove portion 105 is disposed in part of a space between adjacent lead frames 31, of a plurality of lead frames 31, between which the difference in voltage is greater than or equal to a determined value along the adjacent lead frames 31. With an increase in electric field strength, migration tends to occur. That is to say, with an increase in the difference in voltage between adjacent lead frames 31, migration tends to occur. Accordingly, the groove portion 105 is formed in part of a space between adjacent lead frames 31 between which the difference in voltage is greater than or equal to the determined value along the adjacent lead frames 31. By doing so, the influence of migration is effectively curbed in the semiconductor device 100.

In addition, with the semiconductor device 100 the use of the groove portion 105 widens a space. This makes it easy for an electronic part 32, the conductive adhesive 34, and the lead frame 31b to adhere to the sealing resin 40, compared with a case where the block portion 35 (45, 55, 65, or 75) is used. That is to say, the use of the groove portion 105 improves the sealing capability of the sealing resin 40, compared with a case where the block portion 35 (45, 55, 65, or 75) used in the first embodiment is used.

From the above viewpoints, with the semiconductor device 100 the groove portion 105 is used. Compared with a case where the block portion 35 (45, 55, 65, or 75) is used, this improves the sealing capability of the sealing resin 40, prevents the sealing resin 40 from peeling off, and prevents moisture from getting into the lead frame 31b or 31d or the conductive adhesive 34. As a result, with the semiconductor device 100, migration is suppressed and the reliability is improved further.

Furthermore, with the semiconductor device 100 the formation of the groove portion 105 makes the creepage distance between adjacent lead frames 31 long even if the spatial distance between the adjacent lead frames 31 is reduced for miniaturization or the like. As a result, distance longer than or equal to creepage distance corresponding to required withstand voltage is secured. That is to say, with the semiconductor device 100 the formation of the groove portion 105 combines the maintenance of an insulating property and miniaturization.

(Modifications)

Modifications of the groove portion will now be described by the use of FIGS. 6A through 6D and FIGS. 7A through 7D. FIGS. 6A through 6D and FIGS. 7A through 7D illustrate modifications of the groove portion of the semiconductor device according to the second embodiment.

Figure 6A:
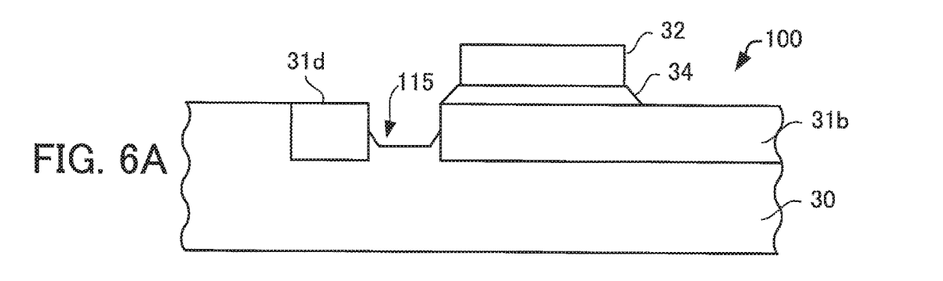
FIGS. 6A, 6B, 6C, and 6D illustrate modifications of a groove portion of the semiconductor device according to the second embodiment (part 1)

A groove portion 115 illustrated in FIG. 6A is formed in the whole of the space between the lead frames 31b and 31d in a cross-sectional view. The groove portion 115 gets narrow on a side opposite the base of the resin case 30 (on the bottom side) so as to slope.

With the semiconductor device 100 the above groove portion 115 is formed. This lengthens the creepage distance between the lead frames 31b and 31d by distance corresponding to the slope, compared with a case where the groove portion 115 is not formed and the bottom of a groove portion formed in the whole of the space between the lead frames 31b and 31d is flat.

Furthermore, by forming this groove portion 115 which gets narrow, that is to say, slopes on the side opposite the base of the resin case 30, the sealing resin 40 gets into an end of the groove portion 115. As a result, it is easy for the sealing resin 40 to adhere to the resin case 30, compared with a case where the groove portion 105 is formed. That is to say, if the groove portion 115 is used, the sealing capability of the sealing resin 40 is large compared with a case where the groove portion 105 is used. Furthermore, with the semiconductor device 100 the formation of the sloping groove portion 115 disperses stress compared with a case where the groove portion 105 is formed. This prevents the sealing resin 40 from peeling off.

From the above viewpoints, with the semiconductor device 100 the groove portion 115 is used. Compared with a case where the groove portion 105 is used, this improves the sealing capability of the sealing resin 40, prevents the sealing resin 40 from peeling off, and prevents moisture from getting into the lead frame 31b or 31d or the conductive adhesive 34. As a result, with the semiconductor device 100, migration is suppressed and the reliability is improved further.

Figure 6B:
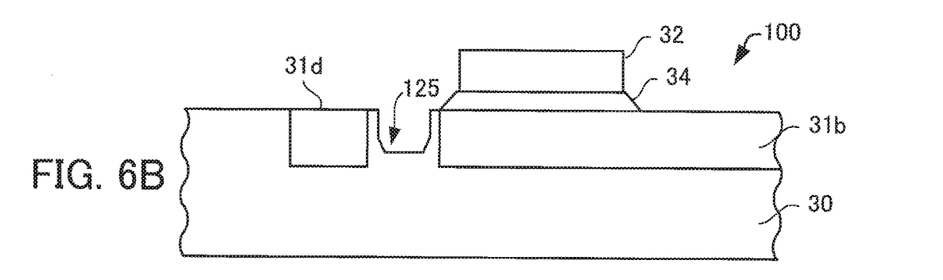

A groove portion 125 illustrated in FIG. 6B is formed in part of the space between the lead frames 31b and 31d. In this case, the width of the groove portion 115 illustrated in FIG. 6A is narrowed so that the lead frames 31b and 31d will not be exposed.

With the semiconductor device 100 the groove portion 125 is used. Compared with a case where the groove portion 105 is used, this improves the sealing capability of the sealing resin 40 and suppresses migration. This is the same with the groove portion 115. Furthermore, the creepage distance is long compared with a case where the groove portion 115 is used.

Figure 6C:
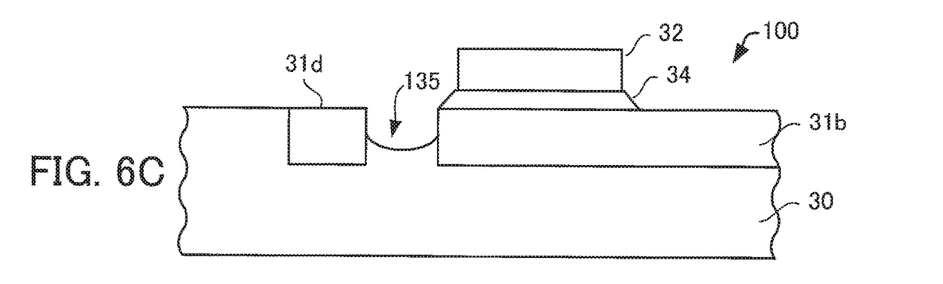

A groove portion 135 illustrated in FIG. 6C is formed in the whole of the space between the lead frames 31b and 31d. The groove portion 135 has a concave elliptic arc shape in a cross-sectional view on a side opposite the base of the resin case 30 (on the bottom side).

With the semiconductor device 100 the above groove portion 135 is formed. This lengthens the creepage distance between the lead frames 31b and 31d by distance corresponding to the elliptic arc shape, compared with a case where the groove portion 135 is not formed and the bottom of a groove portion formed in the whole of the space between the lead frames 31b and 31d is flat.

Furthermore, by forming this groove portion 135 having a concave elliptic arc shape on the side opposite the base of the resin case 30, the sealing resin 40 gets into an end of the groove portion 135. As a result, it is easy for the sealing resin 40 to adhere to the resin case 30, compared with a case where the groove portion 105 is formed. That is to say, if the groove portion 135 is used, the sealing capability of the sealing resin 40 is large compared with a case where the groove portion 105 is used. Furthermore, with the semiconductor device 100 the formation of the groove portion 135 having an elliptic arc shape disperses stress compared with a case where the groove portion 105 is formed. This prevents the sealing resin 40 from peeling off.

From the above viewpoints, with the semiconductor device 100 the groove portion 135 is used. Compared with a case where the groove portion 105 is used, this improves the sealing capability of the sealing resin 40, prevents the sealing resin 40 from peeling off, and prevents moisture from getting into the lead frame 31b or 31d or the conductive adhesive 34. As a result, with the semiconductor device 100, migration is suppressed and the reliability is improved further.

Figure 6D:
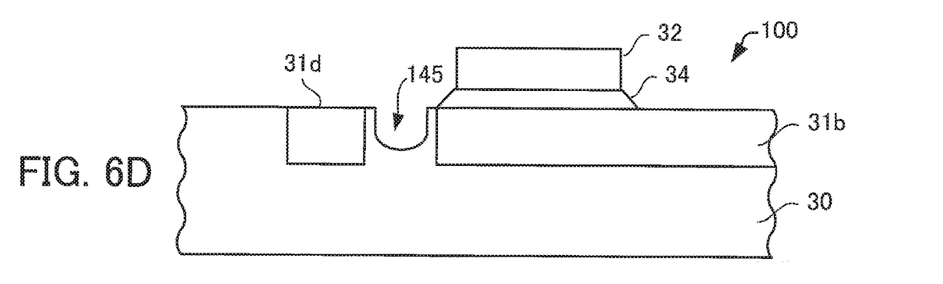

A groove portion 145 illustrated in FIG. 6D is formed in part of the space between the lead frames 31b and 31d. In this case, the width of the groove portion 135 illustrated in FIG. 6C is narrowed so that the lead frames 31b and 31d will not be exposed.

With the semiconductor device 100 the groove portion 145 is used. Compared with a case where the groove portion 105 is used, this improves the sealing capability of the sealing resin 40 and suppresses migration. This is the same with the groove portion 135. Furthermore, the creepage distance is long compared with a case where the groove portion 135 is used.

Figure 7A:
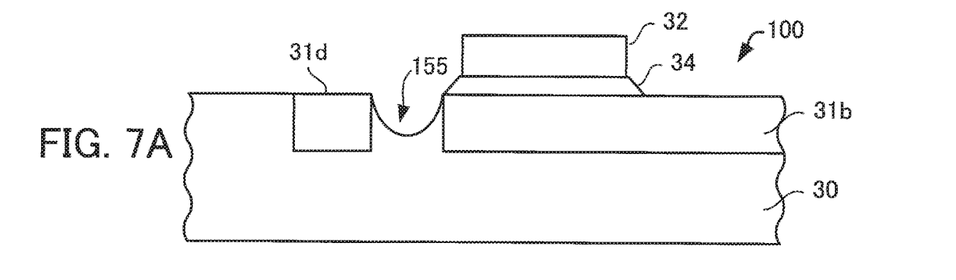
FIGS. 7A, 7B, 7C, and 7D illustrate modifications of the groove portion of the semiconductor device according to the second embodiment (part 2).

A groove portion 155 illustrated in FIG. 7A has an elliptic arc shape in a cross-sectional view and is formed in the whole of the space between the lead frames 31b and 31d. With the semiconductor device 100 the above groove portion 155 is formed. This lengthens the creepage distance between the lead frames 31b and 31d by distance corresponding to the elliptic arc shape, compared with a case where the groove portion 155 is not formed and therefore the space between the lead frames 31b and 31d is flat.

Furthermore, by forming this groove portion 155 having an elliptic arc shape, the sealing resin 40 gets into an end of the groove portion 155. As a result, it is easy for the sealing resin 40 to adhere to the resin case 30, compared with a case where the groove portion 105 is formed. That is to say, if the groove portion 155 is used, the sealing capability of the sealing resin 40 is large compared with a case where the groove portion 105 is used. Furthermore, with the semiconductor device 100 the formation of the groove portion 155 having an elliptic arc shape disperses stress compared with a case where the groove portion 105 is formed. This prevents the sealing resin 40 from peeling off.

From the above viewpoints, with the semiconductor device 100 the groove portion 155 is used. Compared with a case where the groove portion 105 is used, this improves the sealing capability of the sealing resin 40, prevents the sealing resin 40 from peeling off, and prevents moisture from getting into the lead frame 31b or 31d or the conductive adhesive 34. As a result, with the semiconductor device 100, migration is suppressed and the reliability is improved further.

Figure 7B:
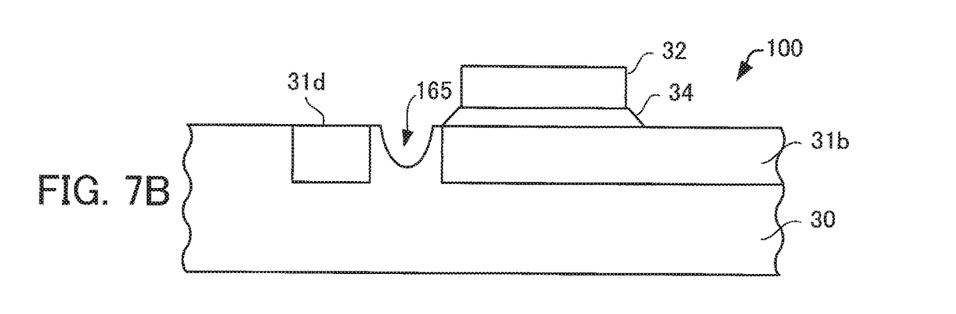

A groove portion 165 illustrated in FIG. 7B is formed in part of the space between the lead frames 31b and 31d. In this case, the width of the groove portion 155 illustrated in FIG. 7A is narrowed. With the semiconductor device 100 the groove portion 165 is used. Compared with a case where the groove portion 105 is used, this suppresses migration. This is the same with the groove portion 155.

Figure 7C:
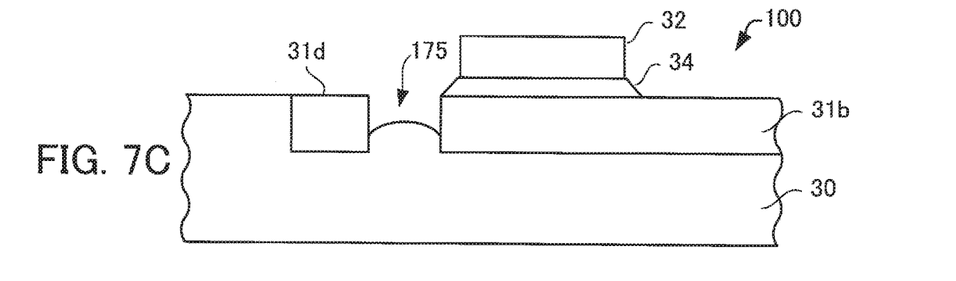

A groove portion 175 illustrated in FIG. 7C is formed in the whole of the space between the lead frames 31b and 31d and has a convex elliptic arc shape in a cross-sectional view on a side opposite the base of the resin case 30 (on the bottom side). With the semiconductor device 100 the above groove portion 175 is formed. This lengthens the creepage distance between the lead frames 31b and 31d by distance corresponding to the elliptic arc shape, compared with a case where the groove portion 175 is not formed and the bottom of a groove portion formed in the whole of the space between the lead frames 31b and 31d is flat.

Furthermore, with the semiconductor device 100 the formation of the groove portion 175 having an elliptic arc shape disperses stress compared with a case where the groove portion 105 is formed. This prevents the sealing resin 40 from peeling off.

From the above viewpoints, with the semiconductor device 100 the groove portion 175 is used. Compared with a case where the groove portion 105 is used, this improves the sealing capability of the sealing resin 40, prevents the sealing resin 40 from peeling off, and prevents moisture from getting into the lead frame 31b or 31d or the conductive adhesive 34. As a result, with the semiconductor device 100, migration is suppressed and the reliability is improved further.

Figure 7D:
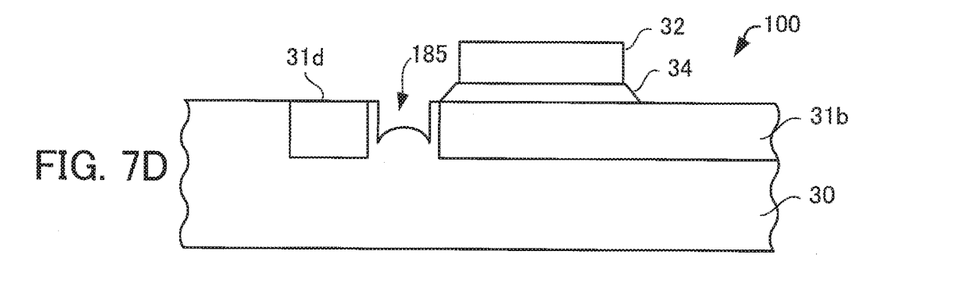

A groove portion 185 illustrated in FIG. 7D is formed in part of the space between the lead frames 31b and 31d. In this case, the width of the groove portion 175 illustrated in FIG. 7C is narrowed so that the lead frames 31b and 31d will not be exposed.

With the semiconductor device 100 the groove portion 185 is used. Compared with a case where the groove portion 105 is used, this improves the sealing capability of the sealing resin 40 and suppresses migration. This is the same with the groove portion 175. Furthermore, the creepage distance is long compared with a case where the groove portion 175 is used.

In addition, with the semiconductor device 100 the use of the groove portion 175 makes the creepage distance long, compared with a case where the groove portion 105 having constant depth is used.

According to the disclosed semiconductor device, the influence of migration is curbed and reliability is improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a case which houses a semiconductor element;
a first wiring pattern disposed in a principal plane of a base of the case at a principal plane thereof;
a second wiring pattern disposed in the base at the principal plane adjacently to the first wiring pattern with a space therebetween; and
a block portion disposed over the space in the principal plane along the first wiring pattern and the second wiring pattern,
wherein the block portion projects from the principal plane of the base of the case in a cross-sectional view, and in a plan view the block portion frames each of the first wiring pattern and the second wiring pattern in a concavity,
wherein the block portion comprises an insulating material, and
wherein the first wring pattern and the second wring pattern are embedded in the base of the case such that surfaces of the first wiring pattern and the second wiring pattern are flush with the principal plane.

2. The semiconductor device according to claim 1, wherein the block portion and the case are made of a same material.

3. The semiconductor device according to claim 1, wherein a height of the block portion is 0.1 to 1.0 times a spatial distance between the first wiring pattern and the second wiring pattern.

4. The semiconductor device according to claim 1, wherein the block portion is rectangular in a cross-sectional view.

5. The semiconductor device according to claim 1, wherein the block portion gets narrow in a cross-sectional view on a side opposite the base so as to slope.

6. The semiconductor device according to claim 1, wherein the block portion has a convex elliptic arc shape in a cross-sectional view on a side opposite the base.

7. The semiconductor device according to claim 1, wherein the block portion has an elliptic arc shape in a cross-sectional view.

8. The semiconductor device according to claim 1, wherein the block portion has a concave elliptic arc shape in a cross-sectional view on a side opposite the base.

9. The semiconductor device according to claim 1, wherein an electronic part is disposed over the first wiring pattern or the second wiring pattern with a conductive adhesive therebetween.

10. The semiconductor device according to claim 1, wherein an inside of the case is sealed with a sealing resin.

11. The semiconductor device of claim 1, wherein the block portion extends over at least a portion of at least one of the first wiring pattern or the second wiring pattern.

12. The semiconductor device according to claim 1, wherein a first voltage and a second voltage are respectively applied to the first wiring pattern and the second wiring pattern, a difference between the first voltage and the second voltage being equal to or greater than a predetermined value.

* * * * *